(12) United States Patent
Raad

(10) Patent No.: US 6,356,492 B1
(45) Date of Patent: Mar. 12, 2002

(54) METHOD AND APPARATUS FOR REDUCING CURRENT DRAIN CAUSED BY ROW TO COLUMN SHORTS IN A MEMORY DEVICE

(75) Inventor: George B. Raad, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/639,991

(22) Filed: Aug. 16, 2000

(51) Int. Cl.⁷ .................................................. G11C 7/00
(52) U.S. Cl. .................... 365/202; 365/203; 365/189.05
(58) Field of Search .................... 365/202, 203, 365/189.05

(56) References Cited

U.S. PATENT DOCUMENTS 5,881,002 A * 3/1999 Hamakawa .................. 365/195
5,896,334 A * 4/1999 Casper ........................ 365/202

* cited by examiner

*Primary Examiner*—A. Zarabian
(74) *Attorney, Agent, or Firm*—Dickstein Shapiro Morin & Oshinsky LLP

(57) ABSTRACT

A latch circuit provides an equilibration voltage to a plurality of equilibrate circuits in a memory device. If a row to column short occurs which draws too much current from the latch circuit, the latch circuit will change states and cease supplying a voltage to the equilibrate circuit, thereby limiting current drain on the memory device.

78 Claims, 3 Drawing Sheets

METHOD AND APPARATUS FOR REDUCING CURRENT DRAIN CAUSED BY ROW TO COLUMN SHORTS IN A MEMORY DEVICE

FIELD OF THE INVENTION

The present invention relates to reducing the current drain in a memory device caused by row to column shorts.

DISCUSSION OF THE RELATED ART

As cell density of memory devices, e.g., DRAM devices, continues to increase, there is a corresponding need to reduce the amount of current drawn by such devices. One source of undesired current draw is row to column shorts. Increasing cell density also increases the number of row to column shorts which may be present in a memory device. If too much current is consumed by row to column shorts, a memory device will not meet strict specifications required for its voltage source, standby current, and self-refresh current.

One solution for dealing with row to column shorts is illustrated in FIG. 1. FIG. 1 illustrates an equilibrate circuit 29 which is typically provided across the complementary digit lines 11 and 13 of a column of a memory device. The equilibrate circuit 29 includes a transistor 23 which is designed to couple the digit lines 11 and 13 together during an equilibrate operation, and a pair of transistors 25 and 27 which provide a voltage from a node A to the respective digit lines 11 and 13. The voltage at node A is in turn supplied through a transistor 35 which has a source coupled to a voltage potential, which is typically equal to half the supply voltage Vcc, that is Vcc/2.

The gate of transistor 35 is coupled to a charge pump output voltage Vccp which causes transistor 35 to continuously supply the voltage Vcc/2 to node A during normal operation of a device. The equilibrate circuit 29 is activated in response to an equilibrate control signal EQ on the equilibrate line 31 to turn on transistors 23, 25 and 27. Equilibration of the digit lines 11 and 13 is performed just prior to a read operation by sense amplifier 37, which is also coupled to the complementary digit lines 11 and 13.

A word line 15 is also illustrated in FIG. 1, which coupled to a gate of a memory cell access transistor 17 which serves to read out charge stored in a cell capacitor 19. A short between a row line 15 and column (digit) line 13 is illustrated as a resistance 21 in FIG. 1. During the equilibration operation word line 15 is grounded. Accordingly, a row to column 21 short will cause a current drain in the path from node A through transistor 27, digit line 13, and word line 15 during the equilibration operation.

In order to limit current when a row to column short exists, the transistor 35 is provided with a relatively long current limiting N-channel, as depicted in FIGS. 2 and 3. FIG. 2 is a sectional side view showing the source and drain regions of transistor 35 and the long channel L, while FIG. 3 illustrates a top view of the long channel L. In one typical arrangement, the width to length of the channel region of transistor 35 is 2.6/19 as shown in FIG. 3.

While the long N-channel does serve to limit current in case of a row to column short to typically 40 uA as the number of row to column shorts increases in different columns of high density memory devices, this conventional technique begins to draw increasing amounts of current, thus hindering the ability of memory device to meet tight voltage and current specifications.

In this regard, it should be noted that while the FIG. 1 circuit shows a long channel transistor 35 connected to a single equilibrate circuit 29, in actual practice transistor 35 is connected to a plurality of equilibrate circuits 29 in a column of a memory device.

As a consequence, as densities of memory devices increase with corresponding increases in row to column shorts, there is a need for an improved circuit for supplying Vcc/2 to the equilibrate circuit 29 which does not consume large amounts of current in the presence of row to column shorts.

SUMMARY OF THE INVENTION

The present invention overcomes the problem with the FIG. 1 circuit by substituting the transistor 35 with a latch circuit which supplies voltage Vcc/2 to one or more equilibrate circuits 29, as long as the current drawn from the latch circuit is below a predetermined threshold. Once the drawn current exceeds the predetermined threshold, the latch circuit switches to a state where voltage is no longer supplied to the equilibrate circuits.

Preferably, the latch circuit is a self-switching circuit, so that as soon as the current drawn from the latch exceeds the predetermined threshold current, the latch self switches to the state where no voltage is supplied to the equilibrate circuits.

BRIEF DESCRIPTION OF THE DRAWINGS

The above and other advantages and features of the invention will be more clearly discerned from the following detailed description of the invention which is provided in connection with the accompanying drawings, in which.

DETAILED DESCRIPTION OF THE PREFERRED EMBODIMENTS

Figure 1:
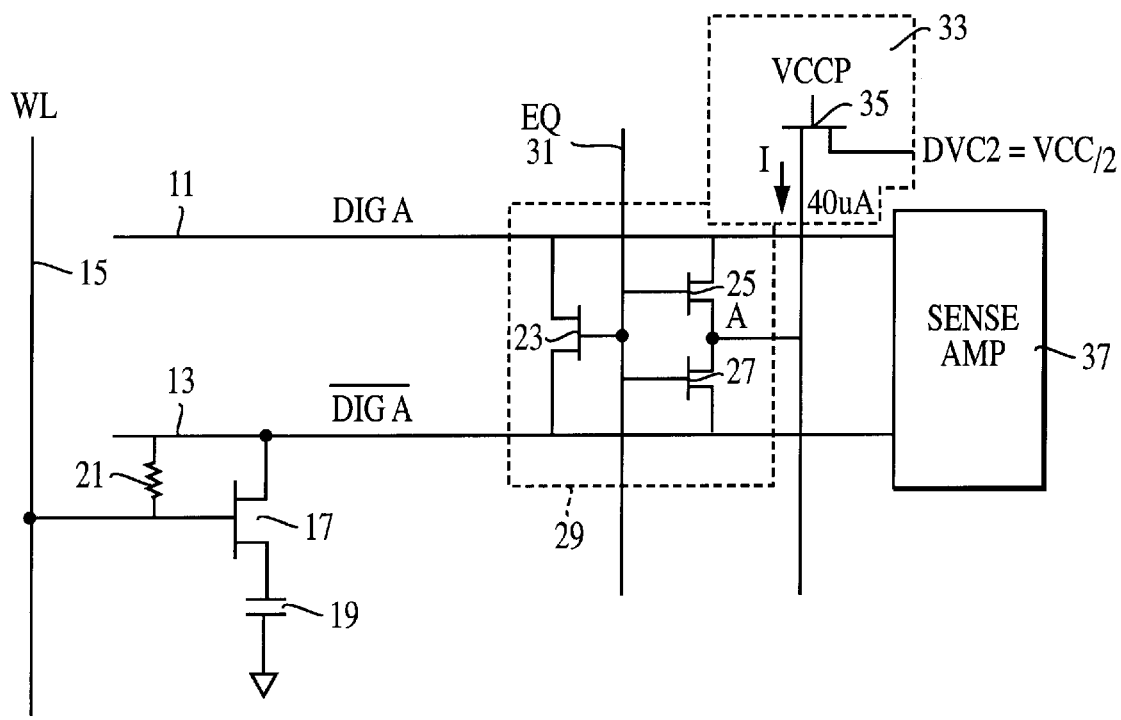
FIG. 1 illustrates a conventional equilibrate circuit and current limiter therefor.
Figure 2:
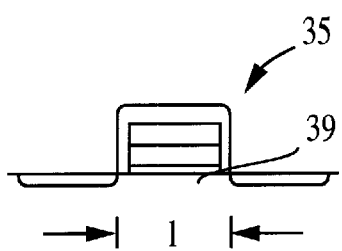
FIG. 2 illustrates a cross-sectional view of a current limiting transistor used in the circuit of FIG. 1.
Figure 3:
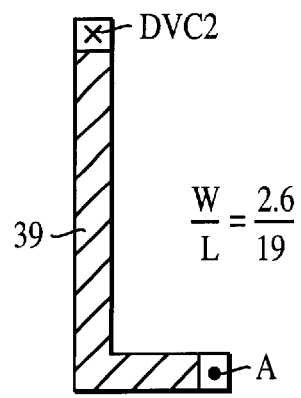
FIG. 3 illustrates a top view of a channel region of the current limiting transistor.
Figure 4:
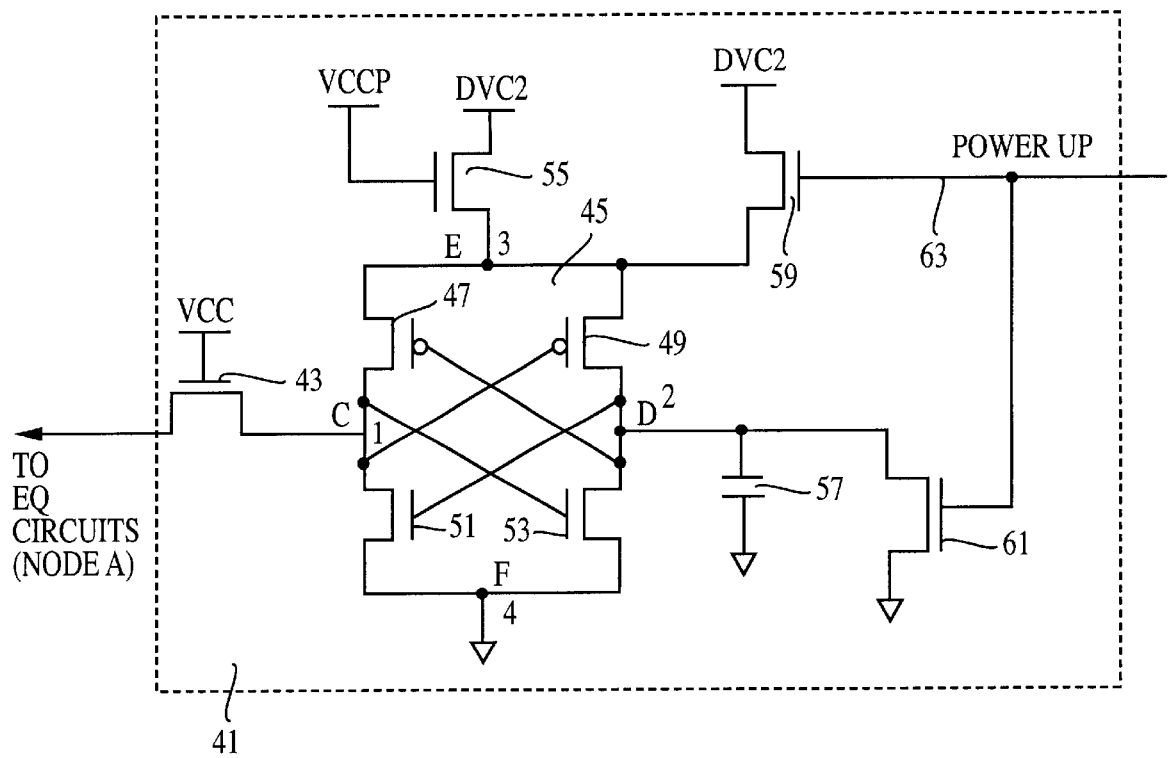
FIG. 4 illustrates a latch circuit constructed in accordance with an exemplary embodiment of the invention.

The present invention replaces the current limiting circuit 33 illustrated in FIG. 1, including transistor 35 which supplies the voltage Vcc/2 to node A, with a new latch circuit 41 illustrated in FIG. 4.

The latch circuit of FIG. 4 is a self-latching circuit in that as long as current drawn from the latch circuit 41 is below a predetermined threshold, voltage is supplied by the latch circuit at node C and through transistor 43 to node A and one or more equilibrate circuits 29.

At the heart of latch circuit 41 is a latch 45 formed by a first pair 47 and 51 of complementary N and P channel MOS transistors, and a second pair 49 and 53 of complementary N and P channel MOS transistors. Each pair of transistors is serially connected, and the two pairs of transistors are connected in parallel across nodes E and F. Nodes C and D define the respective connection point of the complementary transistors 47 and 51 and 49 and 53 and input/output nodes for latch 45.

As illustrated in FIG. 4, the gate of transistor 47 is connected to node D; the gate of transistor 49 is connected to node C; the gate of transistor 51 is connected to node D; and the gate of transistor 53 is connected to node C. This cross-coupling of the transistors forms latch 45. The output of latch 45 is taken at node C, which supplies a voltage from source Vcc/2 through transistors 55 and 47 to the equilibrate circuits 29 through transistor 43.

Latch circuit 41 also contains a capacitor 57 which is connected between node D and ground. Node F of latch circuit 45 is also connected to ground.

A power-up circuit is also provided within latch circuit 41, and includes a power-up signal line 63 upon which a power-up signal appears during power-up of a memory device. The power-up signal line 63 is connected to the gate of a transistor 59 which is coupled between Vcc/2 and node E, and serves to provide additional current to node E during a power-up operation.

Power-up line 63 is also connected to the gate of transistor 61 and serves to force node D to ground. The power-up circuitry, including transistors 59 and 61, ensures that latch 45 will always latch to a first predetermined state which will supply a voltage from Vcc/2 through transistor 55 and transistor 47 to node C, to thereby provide the equilibrate voltage to each of the equilibrate circuits 29 connected to node A.

Capacitor 57 is present for the case where the power-up signal is not working properly and to compensate for all of the capacitance on node A. Further, the device sizes of the latch circuit 41 are skewed to favor transistor 47 being ON.

Transistor 55 can be configured as a current limiting transistor like transistor 35 described above in connection with FIG. 1. The gate of transistor 55 is connected at a voltage supply terminal which supplies a pump voltage Vccp to the gate of transistor 55.

When first powered up, FIG. 4 will assume a first state as noted, wherein a voltage Vcc/2 appears at node C and is applied to node A and to each of the equilibrate circuits 29 connected to node A. This condition will be maintained as long as the current drawn from node C is less than the current drawn at node E by the latch 45 from the terminal supplying the voltage Vcc/2. However, when current drawn from node C begins to equal the current drawn at node E through transistor 55, then latch 45 will switch to a second state whereby transistor 47, previously on, is now turned off. As a consequence, node C is pulled to ground through transistor 51. Latch 45 will remain in this condition and continue to fail to supply any current to the equilibrate circuits 29.

Referring back to FIG. 1 for moment, if a row to column short 21 appears in a memory device employing the FIG. 4 latch circuit, and it causes a current drain at node C in FIG. 4, which exceeds a threshold current, determined by the current drawn at node E through transistor 55, this will cause the latch circuit 45 to self-switch to its second state causing transistor 47 to turn off, decoupling node E and node C.

Figure 5:
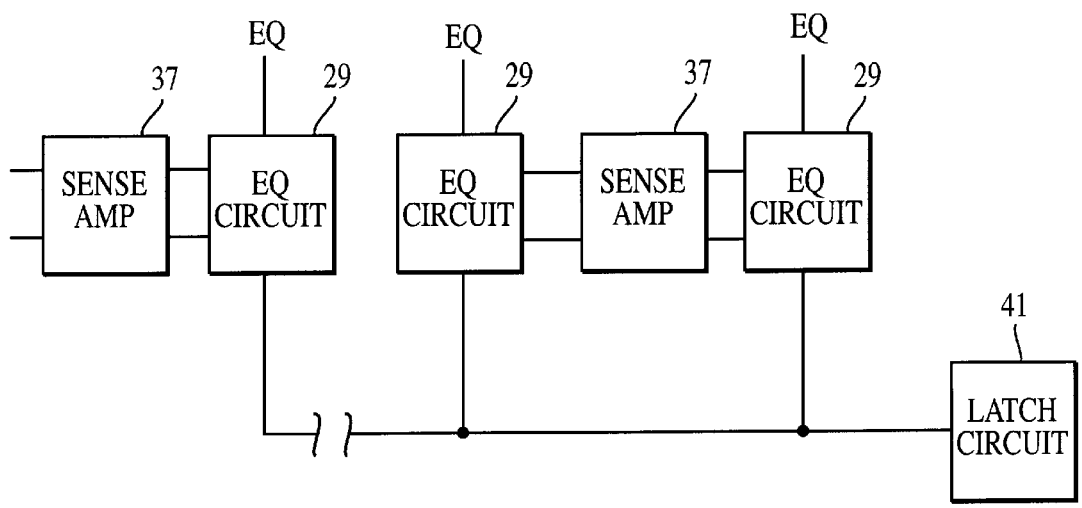
FIG. 5 illustrates the relationship of the latch circuit of FIG. 4 to equilibrate circuits provided in a column of a memory device.

FIG. 5 illustrates the use of latch circuit 41 to supply voltage to a plurality of equilibrate circuits 29 which are connected in a column of a memory device. It should be noted that this is but one arrangement in which latch 41 may find utility. Latch 41 may also be used to simultaneously provide a voltage to equilibrate circuits in one or more columns of a memory device. Also, when a memory device employs segmented columns, a separate latch 41 may be provided for each of the equilibrate circuits of a column segment.

Figure 6:
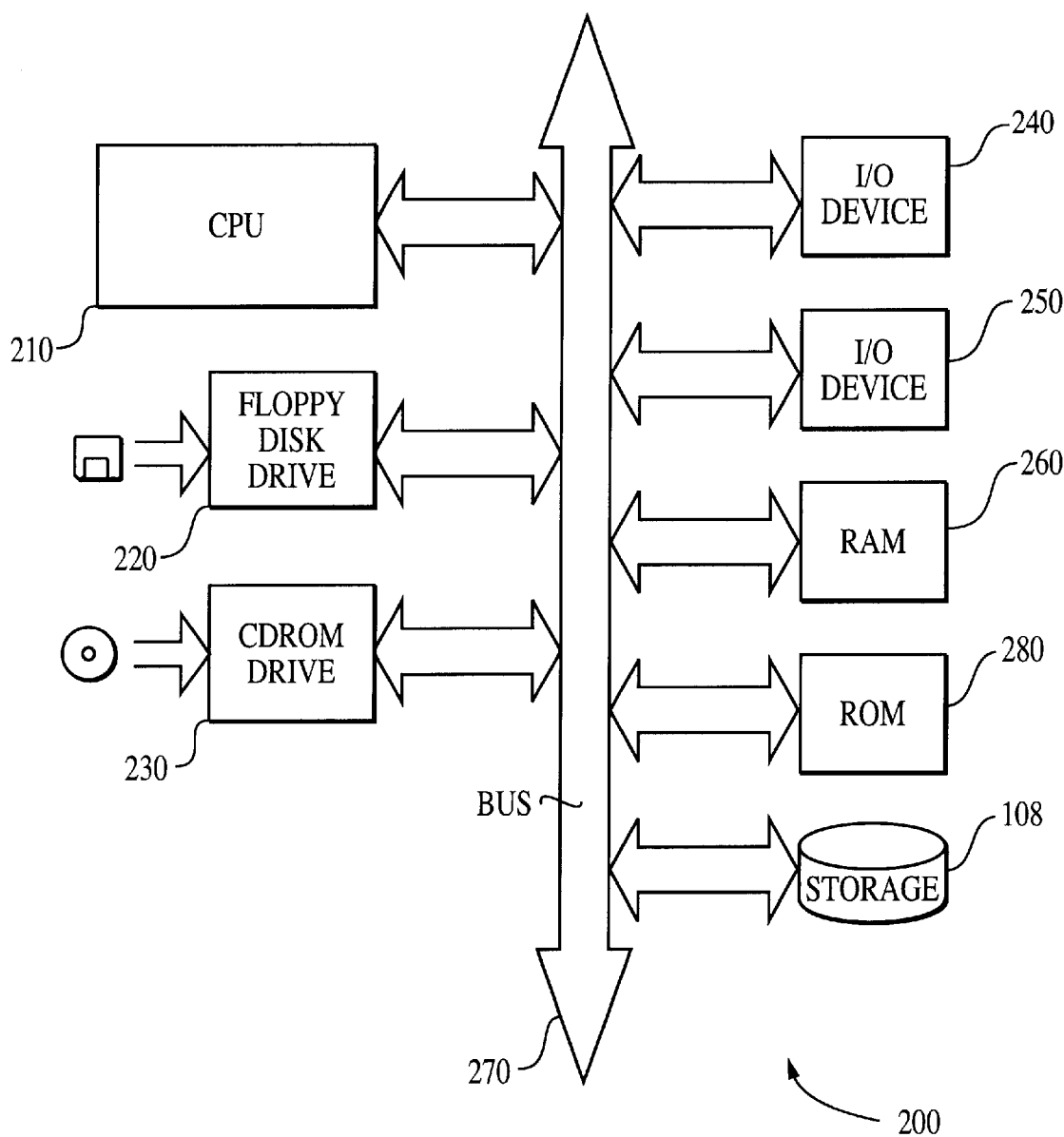
FIG. 6 illustrates a processor circuit which employs a memory device using the FIG. 4 circuit.

FIG. 6 illustrates a processor system which employs a memory device which contains an equilibrate circuit 29 and associated latch circuit 41 of the invention. As shown in FIG. 6, the processor system, such as a computer system, for example, comprises a central processing unit (CPU) 210, for example, a microprocessor, that communicates with one or more input/output (I/O) devices 240, 250 over a bus 270. The computer system 200 also includes random access memory (RAM) 260, a read only memory (ROM) 280 and may include peripheral devices such as a floppy disk drive 220 and a compact disk (CD) ROM drive 230 which also communicates with CPU 210 over the bus 270. The RAM 260 is preferably constructed as one or more integrated circuits which each include a latch circuit 41 as described above. It may also be desirable to integrate the processor 210 and memory 260 on a single IC chip.

Although the invention has been described above in connection with exemplary embodiments, it is apparent that many modifications and substitutions can be made without departing from the spirit or scope of the invention. Accordingly, the invention is not to be considered as limited by the foregoing description, but is only limited by the scope of the appended claims.

What is claimed as new and desired to be protected by Letters Patent of the United States is:

1. A memory device comprising:
   at least one equilibrate circuit for equilibrating complementary digit lines of said memory device; and
   a switching circuit for supplying a voltage to said at least one equilibrate circuit for equilibrating said digit lines, said switching circuit supplying said voltage when a current drawn from said switching circuit is below a predetermined threshold, said switching circuit self-switches off said supply of voltage when said drawn current is above said predetermined threshold.

2. A memory device as in claim 1 wherein said switching circuit is a latch circuit.

3. A memory device as in claim 1 further comprising:
   a plurality of equilibrate circuits equilibrating complementary digit lines in a column of said memory device, each of said equilibrate circuits being connected to receive said voltage from said switching circuit, said switching circuit supplying said voltage to said plurality of equilibrate circuits when said current drawn from said switching circuit is below said predetermined threshold and switching off the supply of voltage to said plurality of equilibrate circuits when said drawn current is above said predetermined threshold.

4. A memory device as in claim 2 wherein said latch circuit comprises:
   a first and second voltage terminal;
   a first pair of complementary transistors; and
   a second pair of complementary transistors;
   said first and second pairs of complementary transistors being cross-coupled and connected across first and second power supply terminals which are respectively coupled to said first and second voltage terminals, to form a latch, an output of said latch being coupled to supply said voltage to said at least one equilibrate circuit.

5. A memory device as in claim 4 wherein said latch circuit further comprises a first transistor for coupling said first voltage terminal to said latch, said first terminal supplying said voltage for said at least one equilibrate circuit at said latch output.

6. A memory device as in claim 5 wherein a gate of said first transistor is coupled to receive a voltage from a charge pump.

7. A memory device as in claim 4 wherein said latch circuit further comprises a second transistor for coupling said latch output to said at least one equilibrate circuit.

8. A memory device as in claim 7 wherein a gate of said second transistor is coupled to receive a supply voltage for said memory device.

9. A memory device as in claim 4 wherein said latch circuit further comprises a power-up circuit for ensuring that said latch powers-up in a predetermined state of supplying said voltage to said at least one equilibrate circuit.

10. A memory device as in claim 9 wherein said power-up circuit comprises a third transistor coupled between said first power supply terminal and first voltage terminal, said third transistor having a gate which receives a power up signal.

11. A memory device as in claim 10 wherein said latch has an input terminal and said power-up circuit further comprises a capacitor coupled to said input terminal and a fourth transistor connected across said capacitor, said fourth transistor having a gate which receives a power-up signal.

12. A memory device as in claim 9 wherein said latch has an input terminal and said power-up circuit comprises a capacitor coupled to said input terminal and a fourth transistor connected across said capacitor, said fourth transistor having a gate which receives a power-up signal.

13. A memory device as in claim 1 wherein said switching circuit is arranged such that when current supplied to it from a voltage source is greater than a current drawn from it by said at least one equilibrate circuit, said switching circuit supplies said voltage to said at least one equilibrate circuit, and when current drawn by said at least one equilibrate circuit exceeds current supplied to said switching circuit from said voltage source, said switching circuit switches and stops supplying said voltage to said at least one equilibrate circuit.

14. A memory device as in claim 2 wherein said latch circuit is arranged such that when current supplied to it from a voltage source is greater than a current drawn from it by said at least one equilibrate circuit, said latch circuit supplies said voltage to said at least one equilibrate circuit, and when current drawn by said at least one equilibrate circuit exceeds current supplied to said latch circuit from said voltage source, said latch circuit switches states and stops supplying said voltage to said at least one equilibrate circuit.

15. A memory device as in claim 2 further comprising a plurality of equilibrate circuits equilibrating complementary digit lines in a column of said memory device, each of said equilibrate circuits being connected to receive said voltage from said latch circuit, said latch circuit supplying said voltage to said plurality of equilibrate circuits when said current drawn from said latch circuit is below said predetermined threshold and switching off the supply of voltage to said plurality of equilibrate circuits when said drawn current is above said predetermined threshold.

16. A memory device as in claim 15 wherein said latch circuit comprises:
   a first and second voltage terminal;
   a first pair of complementary transistors; and
   a second pair of complementary transistors;
   said first and second pair s of complementary transistors being cross-coupled and connected across first and second power supply terminals which are respectively coupled to said first and second voltage terminals to form a latch, an output of said latch being coupled to supply said voltage to said plurality of equilibrate circuits.

17. A memory device as in claim 16 wherein said latch circuit further comprises a first transistor for coupling said first voltage terminal to said latch, said first terminal supplying said voltage for said plurality of equilibrate circuits at said latch output.

18. A memory device as in claim 17 wherein a gate of said first transistor is coupled to receive a voltage from a charge pump.

19. A memory device as in claim 16 wherein said latch circuit further comprises a second transistor for coupling said latch output to said plurality of equilibrate circuits.

20. A memory device as in claim 19 wherein a gate of said second transistor is coupled to receive a supply voltage for said memory device.

21. A memory device as in claim 16 wherein said latch circuit further comprises a power-up circuit for ensuring that said latch powers-up in a predetermined state of supplying said voltage to said plurality of equilibrate circuits.

22. A memory device as in claim 21 wherein said power-up circuit comprises a third transistor coupled between said first power supply terminal and first voltage terminal, said third transistor having a gate which receives a power up signal.

23. A memory device as in claim 22 wherein said latch has an input terminal and said power-up circuit further comprises a capacitor coupled to said input terminal and a fourth transistor connected across said capacitor, said fourth transistor having a gate which receives a power-up signal.

24. A memory device as in claim 21 wherein said latch has an input terminal and said power-up circuit comprises a capacitor coupled to said input terminal and a fourth transistor connected across said capacitor, said fourth transistor having a gate which receives a power-up signal.

25. A memory device as in claim 15 wherein said latch circuit is arranged such that when current supplied to it from a voltage source is greater than a current drawn from it by said plurality of equilibrate circuits, said latch circuit supplies said voltage to said plurality of equilibrate circuits, and when current drawn by said plurality of equilibrate circuits exceeds current supplied to said latch circuit from said voltage source, said latch circuit switches states and stops supplying said voltage to said plurality of equilibrate circuits.

26. A memory device as in claim 2 wherein said latch circuit comprises a latch, said latch comprising:
   a first serially connected complementary pair of NMOS and PMOS transistors, the interconnection of said first pair of transistors defining a first node;
   a second serially connected complementary pair of NMOS and PMOS transistors, the interconnection of said second pair of transistors defining a second node;
   said first and second pairs of serially connected transistors being connected between third and fourth nodes;
   the gates of transistors of said first pair of transistors being connected to said second node, the gates of the transistors of said second pair of transistors being connected to said first node; and
   first and second voltage supply terminals coupled to said third and fourth nodes;
   said first node supplying said voltage for said at least one equilibrate circuit.

27. A memory device as in claim 15 wherein said latching circuit comprises a latch, said latch comprising:
   a first serially connected complementary pair of NMOS and PMOS transistors, the interconnection of said first pair of transistors defining a first node;
   a second serially connected complementary pair of NMOS and PMOS transistors, the interconnection of said second pair of transistors defining a second node;

said first and second pairs of serially connected transistors being connected between third and fourth nodes;

the gates of transistors of said first pair of transistors being connected to said second node, the gates of the transistors of said second pair of transistors being connected to said first node; and first and second voltage supply terminals coupled to said third and fourth nodes;

said first node supplying said voltage for said plurality of equilibrate circuits.

28. A memory device as in claim 26 wherein said latch circuit further comprises a first transistor for coupling said third node to said first voltage supply terminal.

29. A memory device as in claim 27 wherein said latch circuit further comprises a first transistor for coupling said third node to said first voltage supply terminal.

30. A memory device as in claim 28 or 29 wherein a gate of said first transistor is coupled to receive a voltage from a charge pump.

31. A memory device as in claim 26 wherein said latch circuit further comprises a second transistor for coupling said first node to said at least one equilibrate circuit.

32. A memory device as in claim 27 wherein said latch circuit further comprises a second transistor for coupling said first node to said at least one equilibrate circuit.

33. A memory device as in claim 31 or 32 wherein a gate of said second transistor is coupled to receive supply voltage for said memory device.

34. A memory device as in claim 26 wherein said latch circuit further comprises a power-up circuit for ensuring that said latch powers-up in a predetermined state of supplying said voltage to said at least one equilibrate circuit.

35. A memory device as in claim 27 wherein said latch circuit further comprises a power-up circuit for ensuring that said latch powers-up in a predetermined state of supplying said voltage to said at least one equilibrate circuit.

36. A memory device as in claim 34 or 35 wherein said power-up circuit further comprises a third transistor coupled between said first voltage supply terminal and said third node, said third transistor having a gate which receives a power-up signal.

37. A memory device as in claim 34 or 35 wherein said power-up circuit comprises a capacitor coupled to said second node and a fourth transistor connected across said capacitor, said fourth transistor having a gate which receives a power-up signal.

38. A processor system comprising:

a processor; and a memory device coupled to said processor, said memory device comprising:

at least one equilibrate circuit for equilibrating complementary digit lines of said memory device; and a switching circuit for supplying a voltage to said at least one equilibrate circuit for equilibrating said digit lines, said switching circuit supplying said voltage when a current drawn from said switching circuit is below a predetermined threshold, said switching circuit self switches off said supply of voltage when said drawn current is above said predetermined threshold.

39. A system as in claim 38 wherein said switching circuit is a latch circuit.

40. A system as in claim 38 further comprising:

a plurality of equilibrate circuits equilibrating complementary digit lines in a column of said memory device, each of said equilibrate circuits being connected to receive said voltage from said switching circuit, said switching circuit supplying said voltage to said plurality of equilibrate circuits when said current drawn from said switching circuit is below said predetermined threshold and switching off the supply of voltage to said plurality of equilibrate circuits when said drawn current is above said predetermined threshold.

41. A system as in claim 39 wherein said latch circuit comprises:

a first and second voltage terminal;

a first pair of complementary transistors; and a second pair of complementary transistors;

said first and second pairs of complementary transistors being cross-coupled and connected across first and second power supply terminals which are respectively coupled to said first and second voltage terminals to form a latch, an output of said latch being coupled to supply said voltage to said at least one equilibrate circuit.

42. A system as in claim 41 wherein said latch circuit further comprises a first transistor for coupling said first voltage terminal to said latch, said first terminal supplying said voltage for said at least one equilibrate circuit at said latch output.

43. A system as in claim 42 wherein a gate of said first transistors is coupled to receive a voltage from a charge pump.

44. A system as in claim 41 wherein said latch circuit further comprises a second transistor for coupling said latch output to said at least one equilibrate circuit.

45. A system as in claim 44 wherein a gate of said second transistor is coupled to receive a supply voltage for said memory device.

46. A system as in claim 41 wherein said latching circuit comprises a power-up circuit for ensuring that said latch powers-up in a predetermined state of supplying said voltage to said at least one equilibrate circuit.

47. A system as in claim 46 wherein said power-up circuit comprises a third transistor coupled between said first power supply terminal and first voltage terminal, said third transistor having a gate which receives a power up signal.

48. A system as in claim 47 wherein said latch has an input terminal and said power-up circuit further comprises a capacitor coupled to said input terminal and a fourth transistor connected across said capacitor, said fourth transistor having a gate which receives a power-up signal.

49. A system as in claim 46 wherein said latch has an input terminal and said power-up circuit comprises a capacitor coupled to said input terminal and a fourth transistor connected across said capacitor, said fourth transistor having a gate which receives a power-up signal.

50. A system as in claim 38 wherein said switching circuit is arranged such that when current supplied to it from a voltage source is greater than a current drawn from it by said at least one equilibrate circuit, said switching circuit supplies said voltage to said at least one equilibrate circuit, and when current drawn by said at least one equilibrate circuit exceeds current supplied to said switching circuit from said voltage source, said switching circuit switches and stops supplying said voltage to said at least one equilibrate circuit.

51. A system as in claim 39 wherein said latch circuit is arranged such that when current supplied to it from a voltage source is greater than a current drawn from it by said at least one equilibrate circuit, said latch circuit supplies said voltage to said at least one equilibrate circuit, and when current drawn by said at least one equilibrate circuit exceeds current supplied to said latch circuit from said voltage source, said latch circuit switches states and stops supplying said voltage to said at least one equilibrate circuit.

52. A system as in claim 39 further comprising a plurality of equilibrate circuits equilibrating complementary digit lines in a column of said memory device, each of said equilibrate circuits being connected to receive said voltage from said latch circuit, said latch circuit supplying said voltage to said plurality of equilibrate circuits when said current drawn from said latch circuit is below said predetermined threshold and switching off the supply of voltage to said plurality of equilibrate circuits when said drawn current is above said predetermined threshold.

53. A system as in claim 52 wherein said latch circuit comprises:
   a first and second voltage terminal;
   a first pair of complementary transistors; and
   a second pair of complementary transistors;
      said first and second pairs of complementary transistors being cross-coupled and connected across first and second power supply terminals which are respectively coupled to said first and second voltage terminals to form a latch, an output of said latch being coupled to supply said voltage to said plurality of equilibrate circuits.

54. A system as in claim 53 wherein said latch circuit further comprises a first transistor for coupling said first voltage terminal to said latch, said first terminal supplying said voltage for said plurality of equilibrate circuits at said latch output.

55. A system as in claim 54 wherein a gate of said first transistor is coupled to receive a voltage from a charge pump.

56. A system as in claim 52 wherein said latch circuit further comprises a second transistor for coupling said latch output to said plurality of equilibrate circuits.

57. A system as in claim 56 wherein a gate of said second transistor is coupled to receive a supply voltage for said memory device.

58. A system as in claim 53 wherein said latch circuit further comprises a power-up circuit for ensuring that said latch powers-up in a predetermined state of supplying said voltage to said plurality of equilibrate circuits.

59. A system as in claim 58 wherein said power-up circuit comprises a third transistor coupled between said first power supply terminal and first voltage terminal, said third transistor having a gate which receives a power up signal.

60. A system as in claim 59 wherein said latch has an input terminal and said power-up circuit further comprises a capacitor coupled to said input terminal and a fourth transistor connected across said capacitor, said fourth transistor having a gate which receives a power-up signal.

61. A system as in claim 58 wherein said latch has an input terminal and said power-up circuit comprises a capacitor coupled to said input terminal and a fourth transistor connected across said capacitor, said fourth transistor having a gate which receives a power-up signal.

62. A system as in claim 39 wherein said latch circuit is arranged such that when current supplied to it from a voltage source is greater than a current drawn from it by said plurality of equilibrate circuits, said latch circuit supplies said voltage to said plurality of equilibrate circuits, and when current drawn by said plurality of equilibrate circuits exceeds current supplied to said latch circuit from said voltage source, said latch circuit switches states and stops supplying said voltage to said plurality of equilibrate circuits.

63. A system as in claim 39 wherein said latch circuit comprises a latch, said latch comprising:
   a first serially connected complementary pair of NMOS and PMOS transistors, the interconnection of said first pair of transistors defining a first node;
   a second serially connected complementary pair of NMOS and PMOS transistors, the interconnection of said second pair of transistors defining a second node;
   said first and second pairs of serially connected transistors being connected between third and fourth nodes;
   the gates of transistors of said first pair of transistors being connected to said second node, the gates of the transistors of said second pair of transistors being connected to said first node; and
   first and second voltage supply terminals coupled to said third and fourth nodes;
   said first node supplying said voltage for said at least one equilibrate circuit.

64. A system as in claim 52 wherein said latch circuit comprises a latch, said comprising:
   a first serially connected complementary pair of NMOS and PMOS transistors, the interconnection of said first pair of transistors defining a first node;
   a second serially connected complementary pair of NMOS and PMOS transistors, the interconnection of said second pair of transistors defining a second node;
   said first and second pairs of serially connected transistors being connected between third and fourth nodes;
   the gates of transistors of said first pair of transistors being connected to said second node, the gates of the transistors of said second pair of transistors being connected to said first node; and
   first and second voltage supply terminals coupled to said third and fourth nodes;
   said first node supplying said voltage for said plurality of equilibrate circuits.

65. A system as in claim 63 wherein said latch circuit further comprises a first transistor for coupling said third node to said first voltage supply terminal.

66. A system as in claim 64 wherein said latch circuit further comprises a first transistor for coupling said third node to said first voltage supply terminal.

67. A system as in claim 65 or 66 wherein a gate of said first transistors is coupled to receive a voltage from a charge pump.

68. A system as in claim 63 wherein said latch circuit further comprises a second transistor for coupling said first node to said at least one equilibrate circuit.

69. A system as in claim 64 wherein said latch circuit further comprises a second transistor for coupling said first node to said at least one equilibrate circuit.

70. A system as in claim 68 or 69 wherein a gate of said second transistor is coupled to receive a supply voltage for said memory device.

71. A system as in claim 63 wherein said latch circuit further comprises a power-up circuit for ensuring that said latch powers-up in a predetermined state of supplying said voltage to said at least one equilibrate circuit.

72. A system as in claim 64 wherein said latch circuit further comprises a power-up circuit for ensuring that said latch powers-up in a predetermined state of supplying said voltage to said at least one equilibrate circuit.

73. A system as in claim 71 or 72 wherein said power-up circuit further comprises a third transistor coupled between said first voltage supply terminal and said third node, said third transistor having a gate which receives a power-up signal.

74. A system as in claim 71 or 72 wherein said power-up circuit further comprises a capacitor coupled to said second node and a fourth transistor connected across said capacitor, said fourth transistor having a gate which receives a power-up signal.

75. A method of operating a memory device, said method comprising, supplying a voltage to at least one equilibrate circuit from a voltage source when the current drawn by said at least one equilibrate circuit is less than a predetermined value, and stopping the supply of voltage to said at least one equilibrate circuit when said drawn current is greater than said predetermined value, wherein said voltage is supplied to said at least one equilibrate circuit through a latch circuit which latches in a first state where said latch circuit supplies voltage to said at least one equilibrate circuit when said drawn current is less than said predetermined threshold and self-latches into a second state where no voltage is supplied to said at least one of equilibrate circuits when said drawn current is greater than said predetermined threshold.

76. A method as in claim 75 wherein said at least one equilibrate circuit is a plurality of equilibrate circuits.

77. A method as in claim 76 wherein said plurality of equilibrate circuits include a first plurality of equilibrate circuits in a column of said memory device.

78. A method as in claim 76 further comprising biasing said latch circuit at power-up into said first state.

* * * * *